United States Patent
Deng et al.

(10) Patent No.: US 11,823,728 B2
(45) Date of Patent: *Nov. 21, 2023

(54) DYNAMIC REFRESH RATE CONTROL

(71) Applicant: Apple Inc., Cupertino, CA (US)

(72) Inventors: Liang Deng, Saratoga, CA (US); Norman J. Rohrer, San Jose, CA (US); Yizhang Yang, Sunnyvale, CA (US); Arpit Mittal, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/687,107

(22) Filed: Mar. 4, 2022

(65) Prior Publication Data

US 2022/0254410 A1   Aug. 11, 2022

Related U.S. Application Data

(63) Continuation of application No. 17/182,341, filed on Feb. 23, 2021, now Pat. No. 11,270,753, which is a
(Continued)

(51) Int. Cl.
*G11C 7/00* (2006.01)
*G11C 11/406* (2006.01)
(Continued)

(52) U.S. Cl.
CPC .... *G11C 11/40626* (2013.01); *G11C 11/4074* (2013.01); *G11C 11/4091* (2013.01); *G11C 2211/4061* (2013.01)

(58) Field of Classification Search
CPC .......... G11C 11/40626; G11C 11/4074; G11C 11/4091; G11C 2211/4061
(Continued)

(56) References Cited

U.S. PATENT DOCUMENTS

| 5,784,328 A | 7/1998 | Irrinki |
| 6,438,057 B1 | 8/2002 | Ruckerbauer |

(Continued)

FOREIGN PATENT DOCUMENTS

| WO | 2013095674 A1 | 6/2013 |
| WO | 2015025732 A1 | 2/2015 |

OTHER PUBLICATIONS

Mohammadsadegh Sadri, Matthias Jungy, Christian Weisy, Norbert Wehny and Luca Benini; "Energy Optimization in 3D MPSoCs with Wide-I/O DRAM Using Temperature Variation Aware Bank-wise Refresh," hllps://www.date-::onference.com/files/proceedings/2014/pdffiles/10.3_6_ip5-4.pdf; Mar. 11, 2014; 4 pages.
(Continued)

*Primary Examiner* — Vu A Le
(74) *Attorney, Agent, or Firm* — Kowert, Hood, Munyon, Rankin & Goetzel, P.C.

(57) ABSTRACT

In an embodiment, a memory controller in an integrated circuit may generate refreshes for one or more DRAMs coupled to the integrated circuit according to a refresh rate. The integrated circuit may include one or more temperature sensors. A rate of change of the temperature may be determined from the temperature sensors. If the rate is greater than a threshold, the memory controller may generate refreshes according to a refresh rate specified by the DRAMs. If the rate is less than the threshold, the memory controller may generate refreshes at a reduced refresh rate.

20 Claims, 5 Drawing Sheets

Related U.S. Application Data continuation of application No. 16/515,351, filed on Jul. 18, 2019, now Pat. No. 10,978,136.

(51) Int. Cl.
  *G11C 11/4074* (2006.01)
  *G11C 11/4091* (2006.01)

(58) Field of Classification Search
  USPC ........................................................ 365/222
  See application file for complete search history.

(56) References Cited

U.S. PATENT DOCUMENTS

| | | | |
|---|---|---|---|
| 7,499,359 B2 | 3/2009 | Choi et al. | |
| 8,122,187 B2 | 2/2012 | Walker et al. | |
| 8,537,633 B2 | 9/2013 | Noh et al. | |
| 9,734,887 B1* | 8/2017 | Tavva | G11C 11/40618 |
| 9,911,485 B2 | 3/2018 | Sriramagiri et al. | |
| 10,276,228 B1 | 4/2019 | Lee | |
| 10,978,136 B2* | 4/2021 | Deng | G11C 11/40626 |
| 11,270,753 B2* | 3/2022 | Deng | G06F 13/1636 |
| 2005/0276139 A1 | 12/2005 | Choi | |
| 2006/0006166 A1 | 1/2006 | Chen | |
| 2014/0140156 A1 | 5/2014 | Shoemaker et al. | |
| 2014/0304444 A1* | 10/2014 | Walker | G06F 9/5094 |
| | | | 711/170 |
| 2016/0125921 A1 | 5/2016 | Kambegawa | |
| 2016/0307620 A1 | 10/2016 | Chun | |
| 2019/0018713 A1* | 1/2019 | Foxworth | G06F 9/5094 |

OTHER PUBLICATIONS

SRWO, PCT/US2020/041039, mailed Oct. 10, 2020, 13 pages.
ROC Taiwan Intellectual Property Office, Taiwanese Patent Application No. 109123810, Office Action, dated Mar. 9, 2021, 10 pages {English translation followed by original Chinese language Office Action).

* cited by examiner

DYNAMIC REFRESH RATE CONTROL

This application is a continuation of U.S. patent application Ser. No. 17/182,341, filed on Feb. 23, 2021 and now U.S. Pat. No. 11,270,753, which is a continuation of U.S. patent application Ser. No. 16/515,351, filed on Jul. 18, 2019 and now U.S. Pat. No. 10,978,136. The above applications are incorporated herein by reference in their entireties.

BACKGROUND

Technical Field

Embodiments described herein are related to refresh operation in dynamic random access memory (DRAM).

Description of the Related Art

DRAM is often used as the main memory system in various types of computing systems, from desktop or server computers to laptops, personal digital assistants, smart phones, and other portable devices. In many cases, the power consumed in the DRAM is a significant portion of the overall power. In portable systems, which often operate on a limited power supply such as a battery, reducing the power consumption of components in the systems is key to extending the time that the system can be operated on the limited power supply. Additionally, power consumption leads to heat generation, which must be dissipated in all types of systems.

DRAM memory cells store data as electrical charge on a capacitor, and are subject to leakage of the charge over time. That is, the stored charge can leak away and the value read from the memory cell after the charge has leaked away will be different than the value that was written, which leads to erroneous operation. To prevent the loss/corruption of data stored in the DRAM due to the loss of charge on the capacitor, the memory cells are refreshed periodically (reading the value from the cells and writing the value back). The power consumed to perform the refreshes can be a substantial portion of the overall power consumed in the DRAM.

The required refresh rate to prevent data loss/corruption is specified for a given DRAM, and it is temperature-dependent. As the temperature rises, leakage rates increase and thus the required refresh rate increases (e.g. refreshes need to occur more frequently). Many DRAMs are equipped with a temperature sensor, and the DRAM determines the required refresh rate based on the temperature sensed by the sensor. The DRAM includes a register that can be read to determine the required refresh rate. However, the temperature sensor implemented in most DRAMs is fairly coarse-grain (e.g. ranges of 10-20 degrees Celsius are commonly assigned the same refresh rate). The refresh rate for a given range is the refresh rate required for the high temperature of the range. If the temperature is near the low end of the range for a given refresh rate, the refresh rate is higher than actually required. Additionally, many DRAMs implement a single temperature sensor. To account for potential hot spots that are not near the location of the temperature sensor on the DRAM, the DRAM may apply significant margin on the temperature measurement. If the hot spots do not exist, the refresh rate is higher than actually required. In some cases, the margin may be as high at 10 degrees Celsius or more.

SUMMARY

In an embodiment, one or more DRAMs are packaged in close proximity to an integrated circuit that includes a memory controller to control the DRAMs. The memory controller may generate refreshes for the DRAMs according to a refresh rate. In an embodiment, the integrated circuit includes multiple temperature sensors. A thermal controller may read the sensors and determine a rate of change of the temperature ("temperature change rate"). If the rate is greater than a threshold, the memory controller may generate refreshes according to the refresh rate specified by the DRAMs. If the rate is less than the threshold, the memory controller may generate refreshes at a reduced refresh rate. The reduced refresh rate may be used because, if the rate is less than the threshold, hot spots may not be generated in the DRAMs and the margin in the DRAM temperature measurement may be unnecessary. Additionally, the temperatures read from the temperature sensors on the integrated circuit may be finer grain than the temperature ranges that are mapped by the DRAM to corresponding refresh rates, and thus the reduced rate may be sufficient for the actual temperature. Power consumption may be reduced since the refreshes are performed less frequently than if the refresh rate specified by the DRAM is used.

BRIEF DESCRIPTION OF THE DRAWINGS

The following detailed description makes reference to the accompanying drawings, which are now briefly described.

Figure 1:
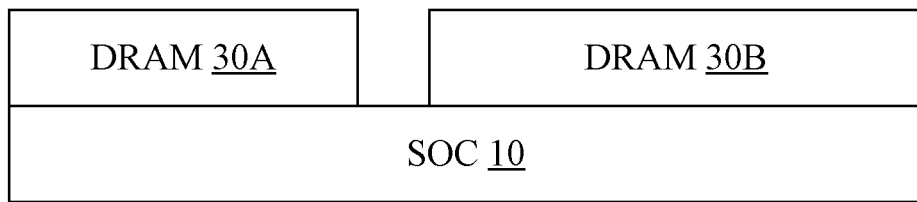
FIG. 1 is a side view of one embodiment of DRAMs packaged with an integrated circuit (a system on a chip (SOC) in this example).

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean "including, but not limited to." As used herein, the terms "first," "second," etc. are used as labels for nouns that they precede, and do not imply any type of ordering (e.g., spatial, temporal, logical, etc.) unless specifically stated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be said to be "configured" to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

This specification may use the words "a" or "an" to refer to an element, or "the" to refer to the element. These words are not intended to mean that there is only one instance of the element. There may be more than one in various embodiments. Thus, "a", "an", and "the" should be interpreted to mean "one or more" unless expressly described as only one.

This specification may describe various components, units, circuits, etc. as being coupled. In some embodiments, the components, units, circuits, etc. may be coupled if they are electrically coupled (e.g., directly connected or indirectly connected through one or more other circuits) and/or communicatively coupled.

DETAILED DESCRIPTION OF EMBODIMENTS

FIG. 1 is a side view of one embodiment of an integrated circuit 10 (in this case, a system on a chip, or SOC, although any integrated circuit may be used in other embodiments) and one or more DRAMs such as DRAMs 30A-30B. Each DRAM 30A-30B may be an integrated circuit as well, and may be coupled in close proximity to the SOC 10. More particularly, the DRAMs 30A-30B may be in contact with the SOC 10, or packaged with the SOC 10. The DRAMs 30A-30B may be in a package-on-package (POP) packaging configuration with the SOC 10, for example. In another implementation, the DRAMs 30A-30B may be in a chip-on-chip (COC) packaging configuration with the SOC 10.

Figure 2:
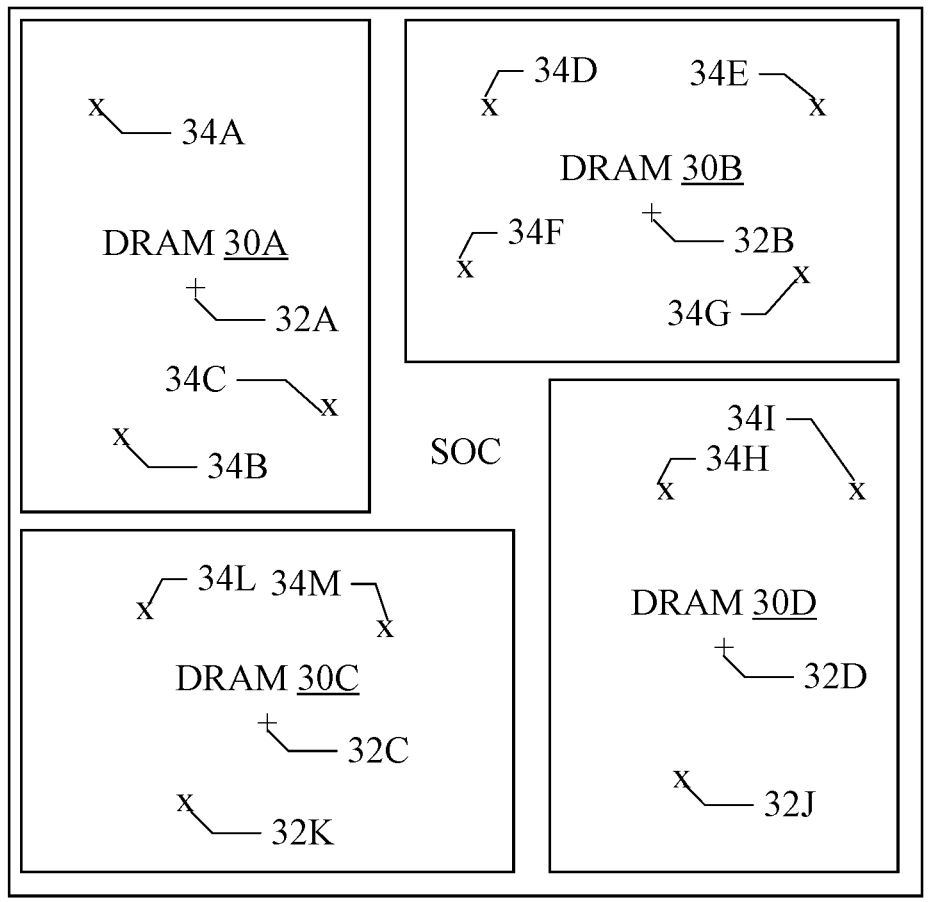
FIG. 2 is a top view of one embodiment of DRAMs package with an integrated circuit.

FIG. 2 is a top view of the SOC 10 with DRAMs 30A-30D arranged on top of the SOC 10, including the DRAMs 30A-30B shown in FIG. 1. That is, the top view shown in FIG. 2 is viewing down from the top, with the side view illustrated in FIG. 1 at the top edge of FIG. 2. The DRAMs 30A-30D may be on top of the SOC 10 in the view of FIG. 2. Each DRAM 30A-30D may include a temperature sensor, illustrated as a plus sign "+" in FIG. 2 (e.g. reference numerals 32A-32D respectively). The temperature sensors 32A-32D may be located in the approximate center of each DRAM 30A-30D, as illustrated in FIG. 2. It is noted that, while four DRAMs 30A-30D are illustrated in FIG. 2, more or fewer DRAMs 30A-30D may be used in other embodiments. Additionally, one or more DRAMs 30A-30D may be stacked on each other and mounted on the SOC 10 as a stack, permitting more DRAMs 30A-30D to be included in the area defined by the size of the SOC 10.

The SOC 10 may also have one or more temperature sensors (e.g. at least one temperature sensor, or a plurality of temperature sensors, in various embodiments), illustrated as "x" in FIG. 2. For example, reference numerals 34A-34C illustrate temperature sensors that are located in the area of the SOC 10 covered by the DRAM 30A, for example. Other temperature sensors 34D-34M may be located in other areas of the SOC 10, as shown in FIG. 2. Generally, the SOC 10 may implement one or more temperature sensors in areas of the SOC 10 that may generate significant heat during operation (e.g. the temperature sensors may be located near the potential hot spots in the SOC). For example, the SOC 10 may include one or more processors that execute the operating system software and various application software on the SOC 10. The processors may generate significant heat in some operating conditions, and thus there may be one or more temperature sensors near the processors. An embodiment of the SOC 10 may include one or more graphics processing units (GPUs) which may generate significant heat in some operating modes, and thus there may be one or more temperature sensors near the GPUs. Other video processing peripherals may similarly have temperature sensors (e.g. an image signal processor (ISP), encoder/decoders, etc.). Peripherals of other types may also have temperature sensors. In other embodiments, additional temperature sensors may be distributed over the area of the SOC 10 so that temperature across the surface of the SOC 10 may be measured with reasonable accuracy. The number and location of temperature sensors may vary from embodiment to embodiment.

A temperature sensor may include any circuitry that may be implemented on an integrated circuit and that reacts to temperature in a predictable fashion. In an embodiment, a temperature sensor may include an analog to digital converter that converts a voltage or current representing the sensed temperature to a digital value that may be communicated with other portions of the integrated circuit. The digital value may be a direct mapping to temperature, or may be adjusted by calibration results to a value that represents the sensed temperature. Other embodiments may measure the temperature in other ways (e.g. the frequency of a ring oscillator that varies with temperature may be used, etc.).

Because of the close proximity of the DRAMs 30A-30D and the SOC 10, there may be significant thermal coupling between the DRAMs 30A-30D and the SOC 10. When the SOC 10 has a "hot spot" due to significant activity in one area of the SOC 10, the heat generated may be transferred to the DRAMs 30A-30D above the area in the SOC 10, creating a hot spot in the DRAM. A hot spot may be a localized area of higher temperature than the temperature of the integrated circuit as a whole. While heat tends to spread and dissipate over time, rapid generation of heat may temporarily create hot spots of increased temperature, which can be tens of degrees Celsius hotter than the surrounding integrated circuit area.

Since the heat is transferred to the DRAMs 30A-30D, the DRAMs 30A-30D may develop hot spots that are physically distant from the temperature sensors 32A-32D in the DRAMs 30A-30D. Because of this effect, the DRAMs 30A-30D may apply margin to the sensed temperature from the temperature sensors 32A-32D when determining the required refresh rate. The margin may ensure that refreshes occur frequently enough to maintain data integrity even if there is a hot spot in the DRAM 30A-30D that is distant from the temperature sensor 32A-32D in that DRAM 30A-30D and thus is not directly sensed by the temperature sensor 32A-32D. In experiments with the SOC 10 and the DRAMs 30A-30D, it was determined that the DRAMs 30A-30D did not generate hot spots due to "self-heating" (e.g. due to operation of the DRAMs 30A-30D themselves), but may have hot spots due to heating from the SOC 10. Accordingly, the margin need not be as large as designed. The temperature sensors 34A-34M in the SOC 10 may be used to detect hot spots and apply refresh margin when needed, and less margin may be applied at other times.

More particularly, the hot spots may develop when the temperature is changing rapidly in the SOC 10. Accordingly, the SOC 10 may implement a refresh control mechanism that uses a more conservative (higher) refresh rate when the temperature is changing rapidly. A less conservative (lower) refresh rate may be used when the temperature is in a more steady-state condition, changing slowly. During the times that the temperature is changing slowly, temperature variations across the DRAM have been experimentally determined to be low. Generally, the refresh rate may refer to how often refreshes are generated to the DRAM. A higher refresh rate means that refreshes are generated more frequently, and a lower refresh rate means that refreshes are generated less frequently. The refresh rate may be specified in terms of how frequently each cell must be refreshed, and refreshes may be generated to ensure that each memory cell has received a refresh within the specified time. A given refresh command (also referred to as a refresh request) may refresh one row of memory cells in one bank of the DRAM (a "per bank" refresh), or one row of memory cells in each bank of the DRAM (an "all bank" refresh). Depending on the number of memory cells that are refreshed by each command, and the number of total memory cells in the DRAM 30A-30D, the number of refresh commands that are needed within a given period of time to ensure the correct refresh of all memory cells may be calculated and the memory controller may generate refresh commands accordingly.

By reducing the refresh rate when the temperature change rate is low, the SOC 10 may reduce the power consumed to perform refreshes as compared to the refresh rate requested by the DRAMs 30A-30D. Because the margin implemented by the DRAMs 30A-30D is known to be unnecessary when the temperature change rate is low, data integrity remains protected even at the reduced refresh rate. On the other hand, when the temperature change rate is high, the SOC 10 may use the more conservative refresh rate requested by the DRAMs 30A-30D to ensure data integrity. In an embodiment, a programmable threshold for the temperature change rate may be used to determine if the temperature change rate is high enough to use the DRAM-specified refresh rate or is low enough to use the reduced refresh rate.

In an embodiment, since the temperatures measurements from the temperature sensors 34A-34M implemented by the SOC 10 are available within the SOC 10, a more granular refresh rate may be generated. For example, as mentioned above, the same refresh rate may be requested by the DRAMs 30A-30D for any temperature within a relatively wide range (e.g. 10-20 degrees Celsius). The SOC 10 may scale the refresh rate at a more granular level, allowing the refresh rate to be closer to the actually-required refresh rate for the current temperature. Additional reduction in power consumption may be achieved due to the finer granularity.

In one embodiment, a typical operating temperature of the SOC 10 may be near the boundary temperature between two refresh rates supported by the DRAMs 30A-30D. With the margin applied by the DRAMs 30A-30D, the higher refresh rate may often be selected during this typical operating condition. The higher refresh rate of the two refresh rates may be double the lower refresh rate of the two refresh rates, and thus the power consumption impact of using the higher refresh rate is significant. If the temperature change rate is low, the margin is unnecessary and a refresh rate nearer to the lower refresh rate may suffice. The selection of the reduced refresh rate may permit the realization of reduced power consumption in these cases.

Figure 3:
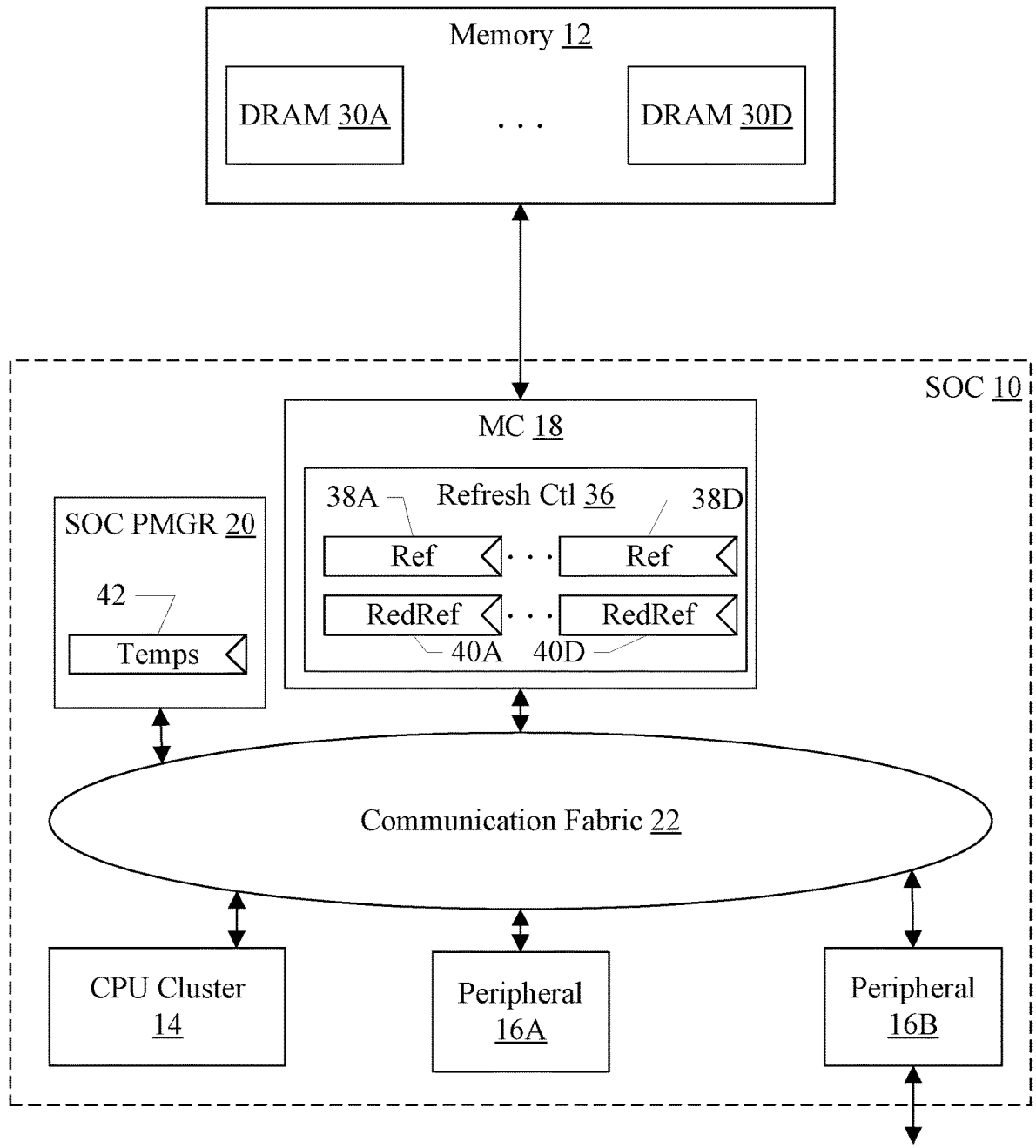
FIG. 3 is a block diagram of one embodiment of an integrated circuit (SOC) and memory including the DRAMs shown in FIGS. 1 and 2.

FIG. 3 is a block diagram of one embodiment of the SOC 10 and a memory 12 formed from the DRAMs 30A-30D. The embodiment of FIG. 3 is a logical view of the SOC 10 and DRAMs 30A-30D, which may be physically arranged as discussed above with regard to FIGS. 1 and 2. The temperature sensors 32A-32D and 34A-34M are not illustrated in FIG. 3, but are included. For example, the CPU cluster 14 may have one or more temperature sensors 34A-34M, as may various peripherals 16A-16B which may generate significant heat (e.g. a GPU may be peripheral).

As implied by the name, the components of the SOC 10 may be integrated onto a single semiconductor substrate as an integrated circuit "chip." Other embodiments of integrated circuits having a memory controller 18 to control the memory 12, including generating refresh commands to the memory 12, may be used. However, the SOC 10 will be used as an example herein. In the illustrated embodiment, the components of the SOC 10 include a processor cluster 14. The processors may be central processing units (CPUs), in an embodiment, and thus the processor cluster 14 may be a CPU cluster 14. In the illustrated embodiment, components of the SOC 10 further include peripheral components 16A-16B (more briefly, "peripherals" 16), a memory controller 18, an SOC power manager (PMGR) 20, and a communication fabric 22. The components 14, 16, 18, and 20 may all be coupled to the communication fabric 22, and thus to each other for communication between the components. The memory controller 18 may be coupled to the memory 12 during use.

The memory controller 18 may include a refresh control circuit 36 that generates the refresh commands for each DRAM 30A-30D according to the refresh rate for that DRAM 30A-30D. That is, in the illustrated embodiment, each DRAM 30A-30D may have an independent refresh rate and the memory controller 18 may generate refresh commands to each DRAM 30A-30D independently. In an embodiment, each DRAM 30A-30D may be on a different channel between the memory controller 18 and the memory 12, and thus may be accessed independent of the other DRAMs 30A-30D. Each DRAM 30A-30D may have its own set of open pages, for example, and may be read or written using commands on its channel independent of the reads/writes on the other channels to the other DRAMs 30A-30D.

The refresh control circuit 36 includes refresh rate registers 38A-38D and reduced refresh rate registers 40A-40D. There may be a different refresh rate register 38A-38D for each DRAM 30A-30D, in this embodiment, and a different reduced refresh rate register 40A-40D for each DRAM 30A-30D, allowing refresh rates to be controlled independently for each DRAM 30A-30D. The refresh rate registers 38A-38D may be programmed with the refresh rate requested by the DRAMs 30A-30D, respectively. The reduced refresh rate registers 40A-40D may be programmed with reduced refresh rates that are lower than the corresponding refresh rates requested by the DRAMs 30A-30D.

In an embodiment, the refresh control circuit 36 may select the refresh rates from the refresh rate registers 38A-38D to control the rate at which refresh commands are generated for each DRAM 30A-30D responsive to the temperature change rate exceeding a threshold. The refresh control circuit 36 may select the reduced refresh rates from the reduced refresh rate registers 40A-40D to control the rate at which refresh commands are generated for each DRAM 30A-30D responsive to the temperature change rate not exceeding the threshold. In other embodiments, a location-aware mechanism may be used. That is, the temperature sensors 34A-34M may be grouped according to the DRAM 30A-30D that they are physically near, and the temperature change rate for each group may be used to select the refresh rate for the corresponding DRAM 30A-30D.

In other embodiments, there may be more than one set of reduced refresh rate registers similar to the registers 40A-40D. There may be more than one threshold for the temperature change rate, and respective refresh rates may be selected from the sets of reduced refresh rate registers based on which thresholds have been exceeded or not exceeded. The reduced refresh rates may be programmed in any desired fashion (e.g. instructions executing in the SOC 10 may program the registers 40A-40D through the SOC PMGR 20, or may directly program the refresh control circuit 36 directly).

The SOC PMGR 20 may be configured to control the supply voltage magnitudes requested from the power management unit (PMU) in the system. There may be multiple supply voltages generated by the PMU for the SOC 10. For example, a voltage may be generated for the processor cores in the CPU cluster 14, and another voltage may be generated for other components in the SOC 10. In an embodiment, the other voltage may serve the memory controller 18, the peripherals 16, the SOC PMGR 20, and the other components of the SOC 10 and power gating may be employed based on power domains. There may be multiple supply voltages for the rest of the SOC 10, in some embodiments. In some embodiments, there may also be a memory supply voltage for various memory arrays in the CPU cluster 14 and/or the SOC 10. The memory supply voltage may be used with the voltage supplied to the logic circuitry, which may have a lower voltage magnitude than that required to ensure robust memory operation. The SOC PMGR 20 may be under direct software control (e.g. software may directly request the power up and/or power down of components) and/or may be configured to monitor the SOC 10 and determine when various components are to be powered up or powered down. For the CPU cluster 14, the voltage requests may be provided to the SOC PMGR 20, which may communicate the requests to the PMU to effect the change in supply voltage magnitudes.

Additionally, the SOC PMGR 20 may include one or more temperature registers 42 that may record the temperatures measured by the various temperature sensors 34A-34M. The temperatures may be read periodically, at a rate that may be programmed into the SOC PMGR 20. Alternatively, software executing on the CPU cluster 14 may read the temperatures and record the temperatures in the temperature registers 42, similar temperature registers directly included in the memory controller 18/refresh control circuit 36 (not shown in FIG. 3), and/or in memory 12. The temperature change rate may be calculated based on successive temperature readings from each sensor.

The CPU cluster 14 may include one or more processor cores that act as the CPUs of the SOC 10. The CPUs may generally execute the software that controls overall operation of the system (e.g. operating system software) and various application software that provides the functionality desired in the system. In some embodiments, there may be more than one CPU cluster 14. In some embodiments, the CPU cluster 14 may include one or more shared caches in addition to caches local to each processor.

In addition to the refresh control circuit 36, the memory controller 18 may generally include the circuitry for receiving memory operations from the other components of the SOC 10 and for accessing the memory 12 to complete the memory operations. The memory controller 18 may be configured to access any type of DRAM memory, such as synchronous DRAM (SDRAM) including double data rate (DDR, DDR2, DDR3, DDR4, etc.) DRAM. Low power/ mobile versions of the DDR DRAM may be supported (e.g. LPDDR, mDDR, etc.). The memory controller 18 may include queues for memory operations, for ordering (and potentially reordering) the operations and presenting the operations to the memory 12. The memory controller 18 may further include data buffers to store write data awaiting write to memory and read data awaiting return to the source of the memory operation. In some embodiments, the memory controller 18 may include a memory cache to store recently accessed memory data. In SOC implementations, for example, the memory cache may reduce power consumption in the SOC by avoiding reaccess of data from the memory 12 if it is expected to be accessed again soon. In some cases, the memory cache may also be referred to as a system cache, as opposed to private caches such as the shared cache or caches in the processors, which serve only certain components. Additionally, in some embodiments, a system cache need not be located within the memory controller 18.

The peripherals 16A-16B may be any set of additional hardware functionality included in the SOC 10. For example, the peripherals 16A-16B may include video peripherals such as an image signal processor configured to process image capture data from a camera or other image sensor, display controllers configured to display video data on one or more display devices, graphics processing units (GPUs), video encoder/decoders, scalers, rotators, blenders, etc. The peripherals may include audio peripherals such as microphones, speakers, interfaces to microphones and speakers, audio processors, digital signal processors, mixers, etc. The peripherals may include interface controllers for various interfaces external to the SOC 10 (e.g. the peripheral 16B) including interfaces such as Universal Serial Bus (USB), peripheral component interconnect (PCI) including PCI Express (PCIe), serial and parallel ports, etc. The peripherals may include networking peripherals such as media access controllers (MACs). Any set of hardware may be included.

The communication fabric 22 may be any communication interconnect and protocol for communicating among the components of the SOC 10. The communication fabric 22 may be bus-based, including shared bus configurations, cross bar configurations, and hierarchical buses with bridges. The communication fabric 22 may also be packet-based, and may be hierarchical with bridges, cross bar, point-to-point, or other interconnects.

It is noted that the number of components of the SOC 10 may vary from embodiment to embodiment. There may be more or fewer of each component than the number shown in FIG. 3.

Figure 4:
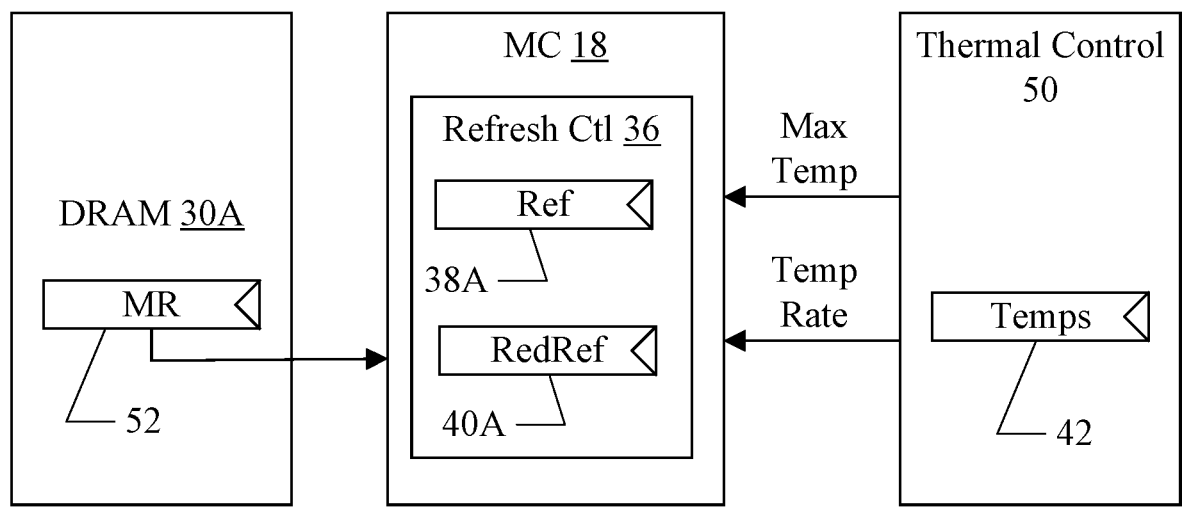
FIG. 4 is a block diagram of one embodiment of a DRAM, a memory controller and a thermal controller.

FIG. 4 is a block diagram illustrating one embodiment of the DRAM 30A coupled to the memory controller 18 and a thermal controller 50 coupled to the memory controller 18. The memory controller 18 may be similarly coupled to the other DRAMs 30B-30D, and similar operation to that described below may be performed with respect to each of the other DRAMs 30B-30D as well. The thermal controller 50 includes or has access to the temperature registers 42 from the SOC PMGR 20. In an embodiment, the thermal controller 50 may include hardware in the SOC PMGR 20 and/or software stored in the memory 12 and executable on the CPU cluster 14 or another processor or cluster in the SOC 10, e.g. a processor in the SOC PMGR 20 (not shown). Any combination of hardware and/or software may be used in various embodiments. The memory controller 18 includes the refresh control circuit 36, and the refresh rate register 38A and reduced refresh rate register 40A corresponding to the DRAM 30A are shown. The DRAM 30A includes a memory refresh (MR) register 52.

The MR register 52 may be defined by the specification of the DRAM 30A to store an indication of the refresh rate requested by the DRAM 30A. That is, the SOC 10 (and more particularly the refresh control circuit 36 in the memory controller 18) may read the MR register 52 to determine the refresh rate. The indication may be a divisor for the base refresh rate for the DRAM. For example, the refresh rate for 85 degrees Celsius may be the base refresh rate. In the range from 65 to 85 degrees, the divisor may be 1. In the range from 45 to 65 degrees, the divisor may be 2, and in the range from 25 to 45 degrees, the divisor may be 4. In the range from 85 to 105 degrees, the divisor may be ½. Alternatively, multipliers may be used and the inverse of the above would be reported from the MR register 52. In yet another alternative, the MR register may report the actual refresh rate rather than a multiplier or divisor. Any representation of the refresh rate may be used.

As mentioned above, the refresh rate indicated by the MR register 52 may be based on the temperature measured by the DRAM 30A (using the temperature sensor 32A, shown in FIG. 2), applying the margin designed into the DRAM 30A (e.g. on the order of 10 degrees Celsius, in an embodiment). The memory controller 18 may periodically read the MR register 52 to obtain the refresh rate and may store an indication of the refresh rate in the refresh rate register 38A. The indication may be the multiplier/divisor mentioned above, or may be a value representing the actual refresh rate (e.g. in terms of clock cycles or time) based on the base refresh rate and the multiplier or divisor.

As mentioned previously, the reduced refresh rate register 40A may be programmed with a reduced refresh rate, compared to the refresh rate in the refresh rate register 38A. The reduced refresh rate may be scaled from the refresh rate based on the current temperature in the SOC 10. The current temperature may be the maximum temperature measured by any of the temperature sensors 34A-34M, provided by the thermal controller 50. Alternatively, the thermal controller 50 may program the reduced refresh rate register 40A based on the maximum measured temperature. Additionally, the thermal controller 50 may determine the temperature change rate based on previous temperature measurements and the current temperature measurements, and may provide the rate to the refresh control circuit 36. Alternatively, the thermal controller 50 may compare the temperature change rate to the threshold used to select between the refresh rate and the reduced refresh rate, and may provide an indication of whether or not the threshold is exceeded to the memory controller 18 to select between the refresh rate and the reduced refresh rate.

Figure 5:
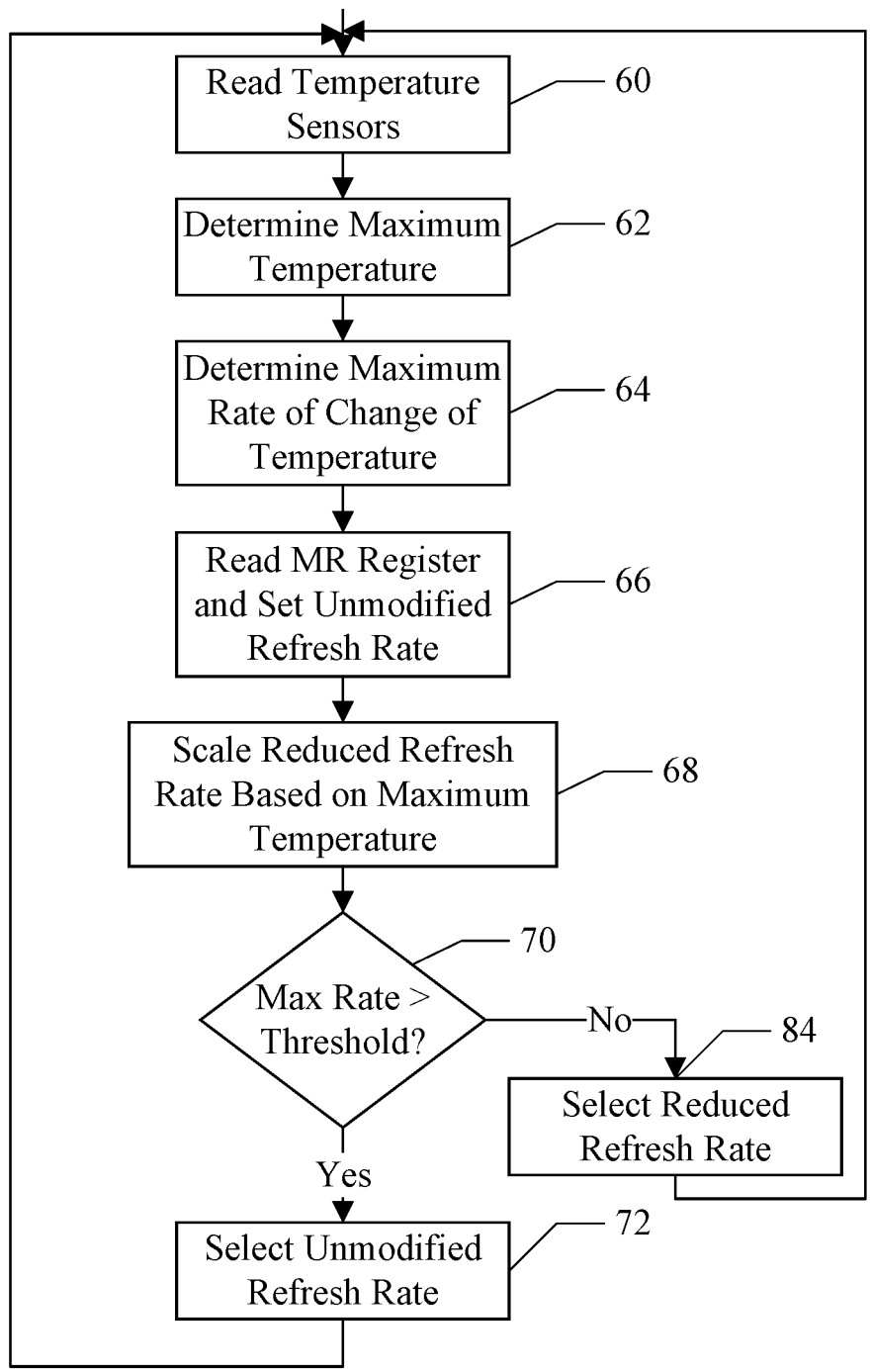
FIG. 5 is a flowchart illustrating operation of one embodiment of the integrated circuit to control refresh of the DRAMs.

FIG. 5 is a flowchart illustrating operation of one embodiment of the SOC 10 to select a refresh rate for a DRAM 30A-30D. While the blocks are shown in a particular order for ease of understanding, other orders may be used. Blocks that are implemented in hardware may be performed in parallel in combinatorial logic forming the hardware. Blocks, combinations of blocks, and/or the flowchart as a whole may be pipelined over multiple clock cycles.

The operation illustrated in FIG. 5 may be performed periodically in the SOC 10. The frequency at which the operation is performed may be related to how quickly temperature may change in the SOC 10. For example, in one embodiment, the operation in FIG. 5 may be performed on the order of once every millisecond. In another embodiment, the operation may be more frequent once per millisecond (e.g. multiple operations per millisecond, or once every 100 microseconds, once over 10 microseconds, etc.). In still another embodiment, the operation may less frequent than once per millisecond (e.g. once every 2 milliseconds, once every 5 milliseconds, once every 10 milliseconds, etc.). Any desired rate may be used.

The thermal controller 50 or PMGR 20 may read the temperature sensors and capture the current temperatures in the registers 42 (block 60). The thermal controller 50 may determine the maximum temperature among the current temperatures (block 62) and may also determine the maximum rate of change of the temperatures (block 64). The temperature change rate may be determined for each temperature sensor from previous temperature measured by that sensor and the current temperature (along with the amount of time between reading the two temperatures). Alternatively, a history of two or more temperatures from each sensor may be used along with the current temperature to determine the temperature change rate. The maximum rate of change may be associated with a temperature other than the maximum temperature (e.g. a lower temperature may be changing more rapidly than the maximum temperature).

The memory controller 18 may read the MR register for each DRAM 30A-30D, and may set the corresponding unmodified refresh rate in the refresh rate registers 38A-38D (block 66). The thermal controller 50 may generate the reduced refresh rate for each DRAM 30A-30D based on the maximum measured temperature (block 68). For example, the thermal controller 50 may scale the unmodified refresh rate, which is associated with the maximum temperature of the range associated with the unmodified refresh rate, along with the margin implemented by the DRAMs 30A-30D, based on the maximum temperature measured by the SOC 10. Alternatively, the reduced refresh rate may be generated based on the specification of the DRAMs 30A-30D (e.g. the refresh corresponding to the maximum temperature measurement, if that temperature were the temperature of the DRAM, without the margin applied.

The thermal controller 50 may compare the maximum temperature change rate to the threshold rate programmed into the thermal controller (decision block 70). If the rate is greater than the threshold (decision block 70, "yes" leg), the thermal controller 50 may communicate to the memory controller 18 to select the unmodified refresh rates from the registers 38A-38D to control refresh rates (block 72). If the rate is less than the threshold (decision block 70, "no" leg), the thermal controller 50 may communicate to the memory controller 18 to select the reduced refresh rate from the registers 40A-40D to control refresh rates (block 74). In another embodiment, the memory controller 18 may be programmed with the threshold and may perform the comparison to the maximum rate of change provided by the thermal controller 50.

Figure 6:
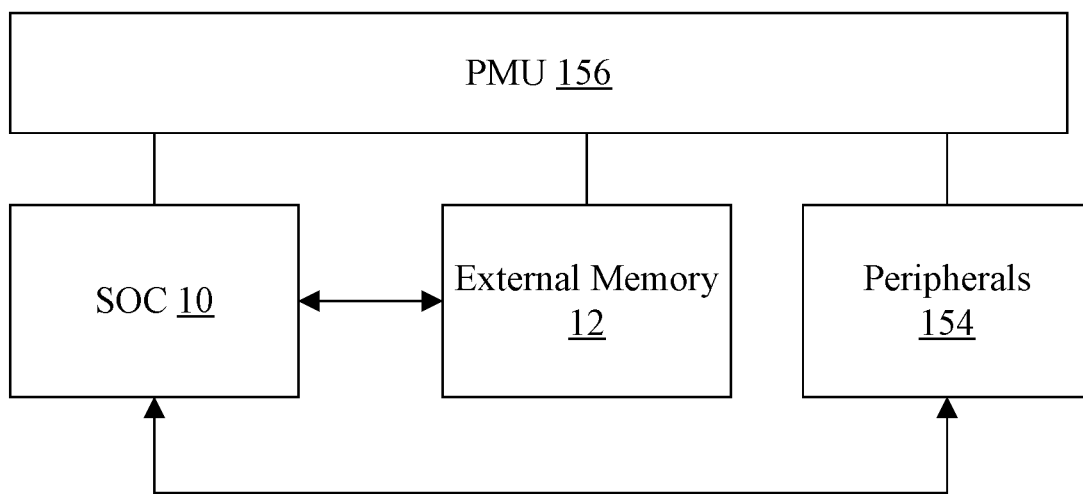
FIG. 6 is a block diagram of one embodiment of a system including the integrated circuit (SOC) and the memory including the DRAMs.

FIG. 6 is a block diagram of one embodiment of a system 150. In the illustrated embodiment, the system 150 includes at least one instance of the SOC 10 coupled to one or more peripherals 154 and the external memory 12. The PMU 156 is provided which supplies the supply voltages to the SOC 10 as well as one or more supply voltages to the memory 12 and/or the peripherals 154. In some embodiments, more than one instance of the SOC 10 may be included (and more than one memory 12 may be included as well). The external memory 12 may include the DRAMs 30A-30D, as previously described.

The PMU 156 may generally include the circuitry to generate supply voltages and to provide those supply voltages to other components of the system such as the SOC 10, the memory 12 various off-chip peripheral components 154 such as display devices, image sensors, user interface devices, etc. The PMU 156 may thus include programmable voltage regulators, logic to interface to the SOC 10 and more particularly the SOC PMGR 20 to receive voltage requests, etc.

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

Numerous variations and modifications will become apparent to those skilled in the art once the above disclosure is fully appreciated. It is intended that the following claims be interpreted to embrace all such variations and modifications.

What is claimed is:

1. An integrated circuit, comprising:
a temperature sensor; and
a memory controller configured to refresh at least one dynamic random access memory (DRAM) at a first refresh rate, wherein the first refresh rate is based on:
a temperature change rate determined from the temperature sensor, wherein the temperature change rate is based on first and second consecutive temperatures sensed by the temperature sensor and an amount of time between sensing the first and second temperatures; and
a second refresh rate specified by the DRAM.

2. The integrated circuit as recited in claim 1, further comprising a plurality of temperature sensors, wherein the memory controller is configured to select the temperature sensor from which to determine the temperature change rate from the plurality of temperature sensors.

3. The integrated circuit as recited in claim 2, wherein the memory controller is configured to select the temperature sensor based on a temperature sensed by the temperature sensor being greater than or equal to the temperatures sensed by other ones of the plurality of temperature sensors.

4. The integrated circuit as recited in claim 1, wherein the memory controller is configured to select the second refresh rate specified by the DRAM as the first refresh rate based on the temperature change rate exceeding a threshold.

5. The integrated circuit as recited in claim 4, wherein the memory controller is configured to select a third refresh rate that is lower than the second refresh rate based on the temperature change rate not exceeding the threshold.

6. The integrated circuit as recited in claim 5, wherein the third refresh rate is scaled from the second refresh rate based on temperatures sensed by the temperature sensor.

7. The integrated circuit as recited in claim 1, wherein the at least one DRAM is in physical contact with the integrated circuit in a package, and wherein the temperature sensor is located in an area of the integrated circuit below the area in which the at least one DRAM is in physical contact with the integrated circuit.

8. An integrated circuit, comprising
a memory controller configured to control a first refresh rate at which the memory controller refreshes one or more dynamic random access memories (DRAMs) that are external to the integrated circuit; and
at least one temperature sensor, wherein a temperature change rate is determined based on successive temperature measurements from the temperature sensor and further based on an amount of time between the successive temperature measurements; wherein:
the memory controller is configured to select the first refresh rate as a second refresh rate received from at least one of the DRAMs based on the temperature change rate exceeding a threshold level;
the memory controller is configured to select the first refresh rate as a lower rate than the second refresh rate based on the temperature change rate not exceeding the threshold level; and
the second refresh rate is based on a temperature sensed in the at least one of the DRAMs.

9. The integrated circuit as recited in claim 8, further comprising a thermal controller configured to detect the temperature change rate.

10. The integrated circuit as recited in claim 8, wherein the lower rate is based on the temperatures sensed by the at least one temperature sensor.

11. The integrated circuit as recited in claim 10, wherein the at least one temperature sensor comprises a plurality of temperature sensors, and wherein a given temperature sensed by the at least one temperature sensor is a maximum temperature measurement from the plurality of temperature sensors.

12. The integrated circuit as recited in claim 8, wherein the lower rate is scaled from the second refresh rate.

13. The integrated circuit as recited in claim 8, wherein the memory controller is configured to control a plurality of the first refresh rates independently for respective DRAMs of the one or more DRAMs.

14. The integrated circuit as recited in claim 13, wherein:
the memory controller is configured to receive a given second refresh rate from a given DRAM of the one or more DRAMs; and
the memory controller is configured to generate a given first refresh rate of the plurality of first refresh rates that corresponds to the given DRAM based on the given second refresh rate from the given DRAM.

15. A method, comprising:
determining a temperature change rate from a temperature sensor in an integrated circuit that includes a memory controller, wherein the temperature change rate is based on a plurality of consecutive temperatures sensed by the temperature sensor;
determining, by the memory controller, a first refresh rate for at least one dynamic random access memory (DRAM) that is external to the integrated circuit, wherein the first refresh rate is based on the temperature change rate and a second refresh rate specified by the DRAM; and
refreshing the DRAM at the first refresh rate.

16. The method as recited in claim 15, further comprising:
selecting, by the memory controller, the temperature sensor from a plurality of temperature sensors in the integrated circuit.

17. The method as recited in claim 16, wherein the selecting is based on a temperature sensed by the temperature sensor being greater than or equal to the temperatures sensed by other ones of the plurality of temperature sensors.

18. The method as recited in claim 15, further comprising:
selecting, by the memory controller, the second refresh rate specified by the DRAM as the first refresh rate based on the temperature change rate exceeding a threshold.

19. The method as recited in claim 18, further comprising:
selecting, by the memory controller, a third refresh rate that is lower than the second refresh rate based on the temperature change rate not exceeding the threshold.

20. The method as recited in claim 19, further comprising:
scaling the third refresh rate from the second refresh rate based on temperatures sensed by the temperature sensor.

* * * * *